(12) United States Patent
Bourjot et al.

(10) Patent No.: US 11,990,436 B2
(45) Date of Patent: May 21, 2024

(54) ELECTRONIC CIRCUIT FOR A HYBRID MOLECULAR BONDING

(71) Applicant: Commissariat à l'Énergie Atomique et aux Énergies Alternatives, Paris (FR)

(72) Inventors: Emilie Bourjot, Grenoble (FR); Amandine Jouve, Grenoble (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 222 days.

(21) Appl. No.: 17/519,957

(22) Filed: Nov. 5, 2021

(65) Prior Publication Data

US 2022/0157752 A1 May 19, 2022

(30) Foreign Application Priority Data

Nov. 16, 2020 (FR) ...................................... 2011734

(51) Int. Cl.
*H01L 21/66* (2006.01)
*H01L 23/00* (2006.01)

(52) U.S. Cl.
CPC .............. *H01L 24/06* (2013.01); *H01L 22/14* (2013.01); *H01L 24/03* (2013.01); *H01L 24/05* (2013.01); *H01L 24/80* (2013.01); *H01L 24/83* (2013.01); *H01L 24/92* (2013.01); *H01L 2224/03921* (2013.01); *H01L 2224/05541* (2013.01); *H01L 2224/05554* (2013.01);

(Continued)

(58) Field of Classification Search
CPC .................... H01L 24/06; H01L 21/66; H01L 2224/06132

See application file for complete search history.

(56) References Cited

U.S. PATENT DOCUMENTS 10,515,913 B2   12/2019   Katkar et al.
11,862,602 B2 *  1/2024   Delacruz ............... H01L 23/481
(Continued)

FOREIGN PATENT DOCUMENTS

EP         3 647 800 A1     5/2020

OTHER PUBLICATIONS

Preliminary Search Report for French Application No. 2011734, dated Aug. 3, 2021.
(Continued)

*Primary Examiner* — Dale E Page
*Assistant Examiner* — Wilner Jean Baptiste
(74) *Attorney, Agent, or Firm* — Wolf, Greenfield & Sacks, P.C.

(57) ABSTRACT

An electronic circuit including a surface intended to be attached to another electronic circuit by hybrid molecular bonding. The electronic circuit includes an electrically-insulating layer exposed on the surface, and, distributed in the electrically-insulating layer, first electrically-conductive bonding pads exposed on a first portion of the surface, the density of the first bonding pads on the first portion of the surface being smaller than 30%, and at least one electrically-conductive test pad, exposed on a second portion of the surface containing a square having a side length greater than 30 μm. The density of electrically-conductive material of the test pad exposed on the second portion of the surface is in the range from 40% to 80%.

10 Claims, 6 Drawing Sheets

(52) U.S. Cl.
CPC ............... *H01L 2224/0603* (2013.01); *H01L 2224/06132* (2013.01); *H01L 2224/80031* (2013.01); *H01L 2224/80895* (2013.01); *H01L 2224/83896* (2013.01); *H01L 2224/9211* (2013.01)

(56) References Cited

U.S. PATENT DOCUMENTS

| | | | |
|---|---|---|---|
| 2019/0096842 A1* | 3/2019 | Fountain, Jr. | ........... H01L 24/03 |
| 2020/0350278 A1 | 11/2020 | Millet | |
| 2021/0296269 A1* | 9/2021 | Sharangpani | ........... H01L 24/06 |

OTHER PUBLICATIONS

Gao et al., Scaling Package Interconnects Below 20μm Pitch with Hybrid Bonding. 2018 IEEE 68th Electronic Components and Technology Conference (ECTC). May 29, 2018:314-22.

Bourjot et al., Towards a complete direct Hybrid Bonding D2W integration flow: Known-good-dies and die planarization modules development. 2019 IEEE International 3D Systems Integration Conference (3DIC). Oct. 8, 2019:1-5.

* cited by examiner

ELECTRONIC CIRCUIT FOR A HYBRID MOLECULAR BONDING

CROSS REFERENCE TO RELATED APPLICATIONS

This application claims priority to French application number 2011734, filed Nov. 16, 2020, the contents of which is incorporated by reference in its entirety.

TECHNICAL BACKGROUND

The present description generally concerns an electronic circuit for the performing of a hybrid molecular bonding.

PRIOR ART

An example of an electronic device manufacturing method comprises forming two integrated circuit boards, each comprising a surface corresponding to the free surface of an insulating layer having hybrid bonding metal pads (HBM) flush therewith, and bonding these surfaces to each other by hybrid molecular bonding, placing into contact the HBM pads of the two boards and the insulating layers of the two boards. The boards can then be cut to separate the electronic devices. Other examples comprise attaching by molecular bonding separate integrated circuit chips to an integrated circuit board or attaching by molecular bonding an integrated circuit chip to another integrated circuit chip.

The performing of a molecular bonding implies an adapted surface state, where the surface must in particular comply with strict flatness, roughness, and cleanness criteria. The obtaining of this adapted surface state generally implies a step of chemical-mechanical planarization of the integrated circuit boards, also called CMP, which generally combines a chemical and mechanical etching. Such a method may require for the different materials present at the surface of the integrated circuit boards to be substantially homogeneously distributed. This is why HBM pads of same dimensions, for example, having square or hexagonal shape, substantially homogeneously distributed across the surface, are used, where certain HMB pads are not electrically connected to other elements of the integrated circuit board and are only used for the hybrid molecular bonding.

The preparation of an electronic circuit for the performing of a hybrid molecular bonding comprises forming an additional interconnection level on the original electric circuit, called bonding interconnection level, particularly comprising depositing a stack of insulating layers and forming the HBM pads in the stack of insulating layers, some of the HBM pads being connected to conductive pads of the electronic circuit by conductive vias (HBV, hybrid bonding vias) formed in the stack of insulating layers.

For certain applications, it is desirable to be able to verify the proper operation of the original electronic circuit before performing the hybrid molecular bonding. For this purpose, before the preparation of the original electronic circuit for the hybrid molecular bonding, it is known to provide conductive pads exposed at the surface of the original electronic circuit enabling to carry out tests. These tests may in particular be performed by using test probes which are applied against the test pads.

However, during the implementation of a method of preparation of the electronic circuit for the implementation of a hybrid molecular bonding, unwanted connections between the test pads and HBM pads may be observed.

SUMMARY

Thus, an object of an embodiment is to at least partly overcome the disadvantages of the previously-described electronic circuits adapted for a hybrid molecular bonding.

Another object of an embodiment is for a test of the proper operation of the electronic circuit to be able to be performed before the hybrid molecular bonding.

An embodiment provides an electronic circuit comprising a surface intended to be attached to another electronic circuit by hybrid molecular bonding. The electronic circuit comprises an electrically-insulating layer exposed on said surface, and, distributed in the electrically-insulating layer, first electrically-conductive bonding pads exposed on a first portion of said surface, the density of the first bonding pads on the first portion of said surface being smaller than 30%, and at least one electrically-conductive test pad, exposed on a second portion of said surface containing a square having a side length greater than 30 µm, the density of electrically-conductive material of the test pad exposed on the second portion of said surface being in the range from 40% to 80% and, everywhere in the second portion of said surface, at least one dimension of the electrically-conductive material of the test pad exposed on the second portion of said surface being smaller than 10 µm.

According to an embodiment, the test pad comprises an electrically-conductive layer exposed on said surface and crossed by openings containing an electrically-insulating material.

According to an embodiment, the test pad comprises second electrically-conductive bonding pads exposed on said surface and laterally separated by the electrically-insulating layer.

According to an embodiment, the test pad has the same composition as the first bonding pads.

According to an embodiment, the density of electrically-conductive material of the test pad exposed on the second portion of said surface is in the range from 50% to 80%.

According to an embodiment, everywhere in the second portion, at least one dimension of the electrically-conductive material of the test pad exposed on the second portion of said surface is smaller than 5 µm.

An embodiment also provides a method comprising manufacturing an electronic circuit comprising a surface intended to be attached to another electronic circuit by hybrid molecular bonding, the electronic circuit comprising an electrically-insulating layer exposed on said surface, and, distributed in the electrically-insulating layer, first electrically-conductive bonding pads exposed on a first portion of said surface, the density of the first boding pads on the first portion of said surface being smaller than 30%, and at least one electrically-conductive test pad, exposed on a second portion of said surface containing a square having a side length greater than 30 µm, the density of electrically-conductive material of the test pad exposed on the second portion of said surface being in the range from 40% to 80% and, everywhere in the second portion of said surface, at least one dimension of the electrically-conductive material of the test pad exposed on the second portion of said surface being smaller than 10 µm.

According to an embodiment, the method comprises the hybrid molecular bonding of said surface to another electronic circuit.

According to an embodiment, the method further comprises a step of testing the operation of the electronic circuit by using the test pad before the hybrid molecular bonding step.

According to an embodiment, the method further comprises a step of planarization of said surface after the test step and before the hybrid molecular bonding step.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DESCRIPTION OF THE EMBODIMENTS

Like features have been designated by like references in the various figures. In particular, the structural and/or functional features that are common among the various embodiments may have the same references and may dispose identical structural, dimensional and material properties. For the sake of clarity, only the steps and elements that are useful for an understanding of the embodiments described herein have been illustrated and described in detail.

In the following description, when reference is made to terms qualifying absolute positions, such as terms "front", "rear", "top", "bottom", "left", "right", etc., or relative positions, such as terms "above", "under", "upper", "lower", etc., or to terms qualifying directions, such as terms "horizontal", "vertical", etc., unless specified otherwise, it is referred to the orientation of the drawings or to an electronic circuit in a normal position of use. Unless specified otherwise, the expressions "around", "approximately", "substantially" and "in the order of" signify within 10%, and preferably within 5%. In the following description, the term "conductive" means electrically conductive and the term "insulating" means electrically insulating.

Unless specified otherwise, when reference is made to two elements connected together, this signifies a direct connection without any intermediate elements other than conductors, and when reference is made to two elements coupled together, this signifies that these two elements can be connected or they can be coupled via one or more other elements.

Figure 1:
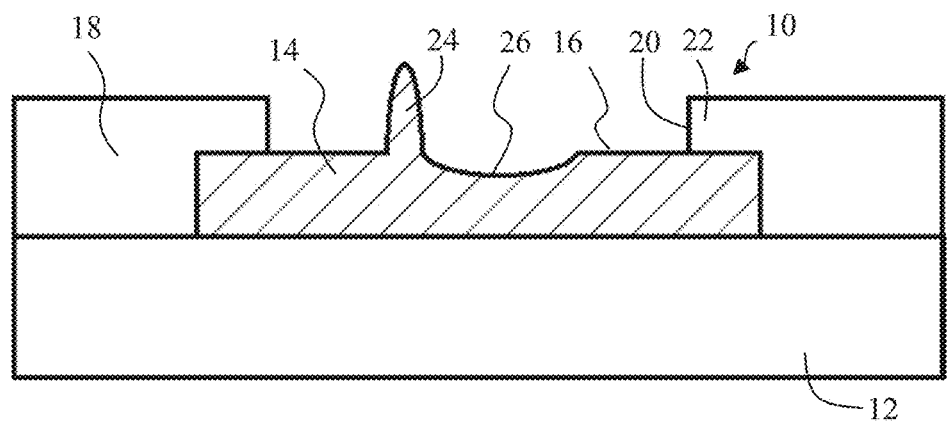
FIG. 1 shows a test pad of an electronic circuit after a test operation.

FIG. 1 is a partial simplified cross-section view of an electronic circuit 10 comprising a base 12, containing the substrate of the electronic circuit, of the electronic components, particularly of the transistors, and the lower metallization levels of electronic circuit 10. Electronic circuit 10 further comprises at least one conductive pad 14, called test pad hereafter, used for test operations before the preparation of electronic circuit 10 for a molecular bonding, test pad 14 resting on base 12 and comprising an upper surface 16. Electronic circuit 10 further comprises an insulating layer 18 covering base 12 and the periphery of test pad 14. Insulating layer 18 is generally formed all over base 12 and test pad 14 and a portion of the upper surface 16 of test pad 14 is exposed by locally etching an opening 20 in insulating layer 18, which causes the forming of an abrupt step 22 at the periphery of the exposed area of test pad 14 having a height from 500 nm to 3 µm. Further, the application of test points on test pad 14 causes the deformation of the upper surface 16 of test pad 14, which has been illustrated by the forming of an asperity 24 and of a hole 26 schematically shown in FIG. 1.

Figure 2:
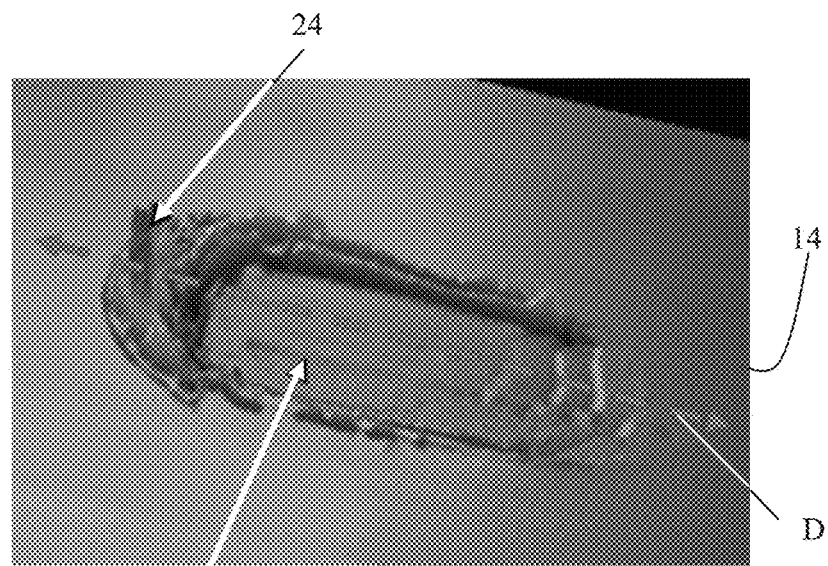
FIG. 2 is an image of a test pad after a test operation.

FIG. 2 is an image obtained by interferometry of a copper test pad 14 after a test operation. An asperity 24 and a recess 26 can in particular be observed.

Figure 3:
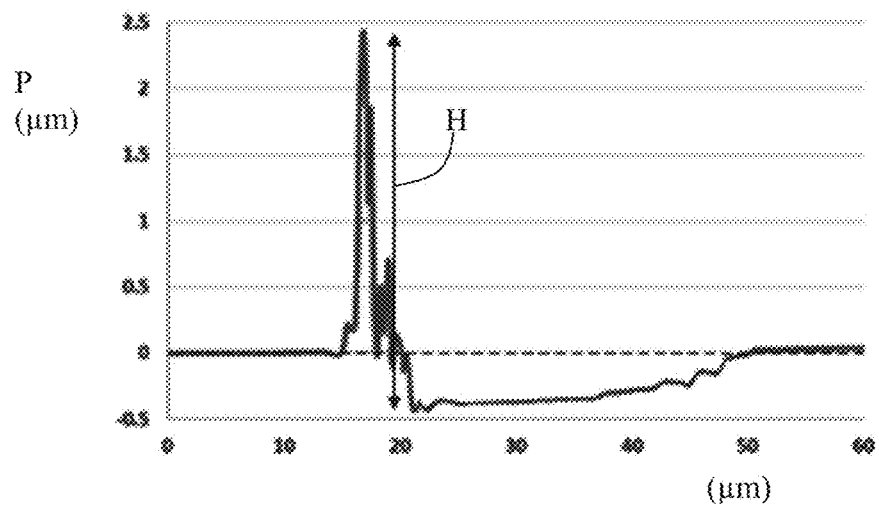
FIG. 3 is a curve of the profile of the test pad of FIG. 2.

FIG. 3 shows a curve of the variation of profile P, expressed in micrometers, of the surface of the test pad 14 of FIG. 2 according to the direction D, expressed in micrometers, indicated in FIG. 2. The maximum interval H between the top of asperity 24 and the bottom of recess 26 is approximately 3 µm. Generally, the inventors have shown that intervals H in the range from 150 nm to 5 µm can be observed.

Figure 4:
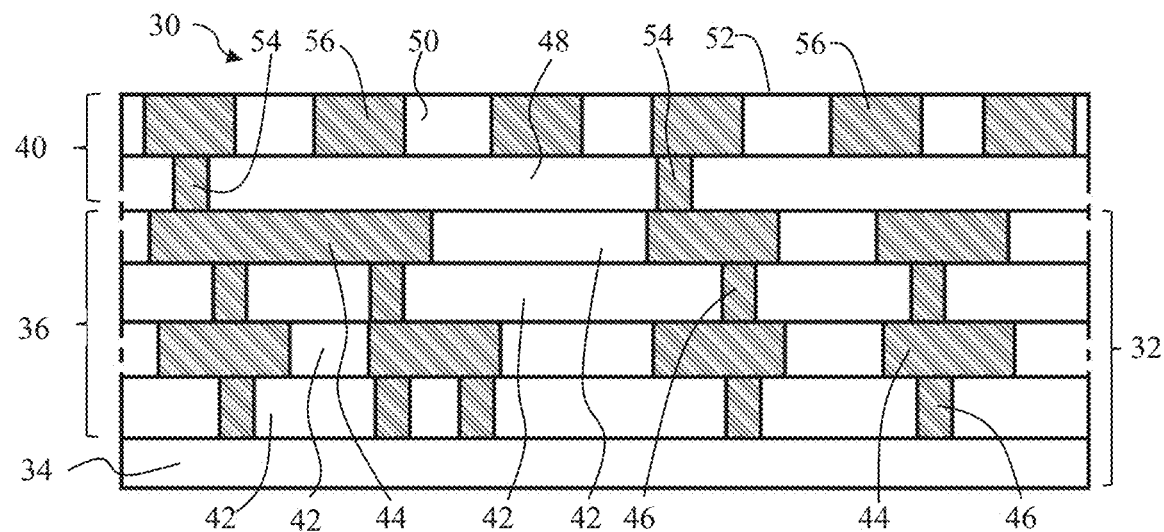
FIG. 4 is a partial simplified lateral cross-section view of an example of an electronic circuit adapted to a hybrid molecular bonding.
Figure 5:
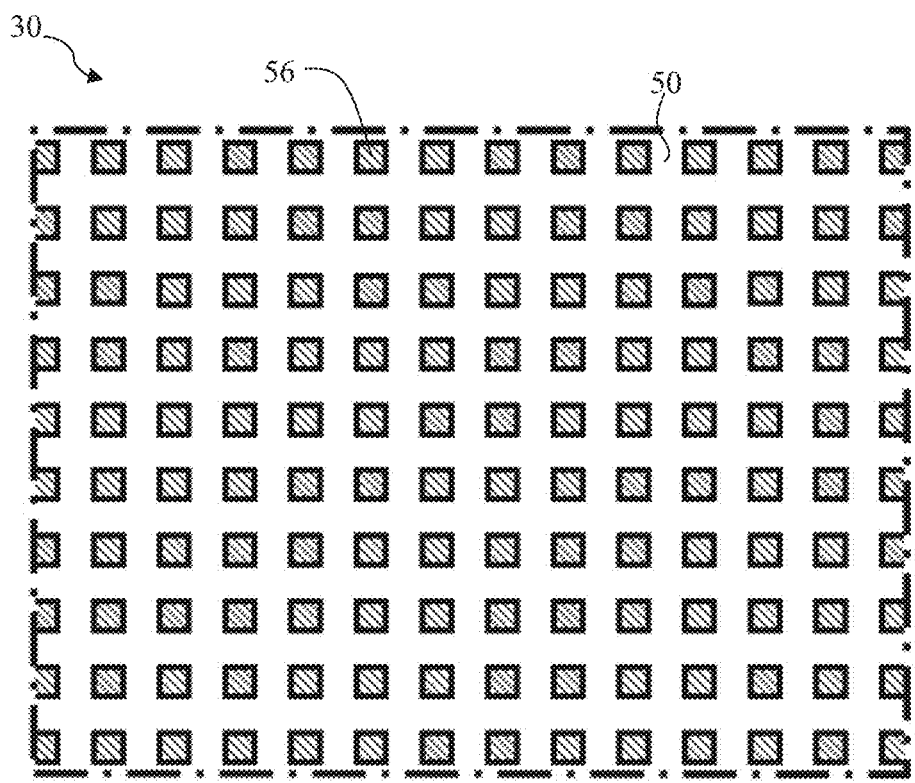
FIG. 5 is a simplified top cross-section view of the electronic circuit of FIG. 4.

FIGS. 4 and 5 respectively are a lateral cross-section view and a top cross-section view, partial and simplified, of an example of an electronic circuit adapted to a hybrid molecular bonding.

Electronic circuit 30 comprises an original electronic circuit 32, a base 34 of which has been shown, containing the substrate of the electronic circuit, electronic components, particularly transistors, and possibly the lower metallization levels of electronic circuit 30, covered with upper interconnection levels 36, the original electronic circuit 32 being covered with a bonding interconnection level 40 for the performing of a hybrid molecular bonding.

Interconnection levels 36 comprise a stack of insulating layers 42, four insulating layers 42 being shown as an example in FIG. 4 between which and through which conductive tracks 44 and conductive vias 46 coupled to the electronic components, not shown, of base 34 are provided. The bonding interconnection level 40 generally comprises a stack of a lower insulating layer 48 and of an upper insulating layer 50. Upper insulating layer 50 delimits a planar bonding surface 52. Conductive vias 54, called HBV hereafter, extend through lower insulating layer 48 and come into contact with conductive tracks 44. Bonding conductive pads 56, called HBM pads hereafter, are flush with bonding surface 52. Certain HBM pads 56 are electrically connected to HBVs 54, but other HBM pads 56 may not be electrically connected to HBVs 54. As a variant, bonding interconnection level 40 may comprise a stack of more than two insulating layers.

FIG. 5 is a top cross-section view in a plane parallel to bonding surface 52 and cutting HBM pads 56. As shown in the drawing, HBM pads 56 may have the same dimensions, in the present example a square cross—section in top view. The cross-section of each HBM pad 56 may be, in top view, inscribed within a square having a side length smaller than 10 µm, preferably smaller than 7 µm, more preferably smaller than 5 µm, more preferably still smaller than 3 µm, in particular smaller than 1 µm. HBM pads 56 are separated from insulating layer 50 by a minimum distance which particularly depends on the dimensions of HBM pads 56, and which may be greater than 500 nm, preferably greater than 1 µm, more preferably greater than 3 µm, more preferably still greater than 5 µm. Further, HBM pads 56 may be substantially homogeneously distributed on bonding surface 52.

Each HBM pad 56 may have a single-layer structure or a multi-layer structure. According to an embodiment, the layer or each layer of HBM pad 56 may be made of a metallic material used for the forming of interconnection levels. According to an embodiment, the layer or each layer of HBM pad 56 may be made of aluminum (Al), of copper (Cu), of an alloy of copper and aluminum, of titanium (Ti), of titanium nitride (TiN), of niobium (Nb), of tungsten (W), or of cobalt (Co). According to an embodiment, each HBM pad 56 may be formed on a layer or a stack of layers playing the role of a bonding layer for the forming of HBM pad 56 and/or of a barrier for the diffusion of the material forming HBM pad 56. As an example, the bonding layer may be made of titanium (Ti) or of titanium nitride (TiN). The bonding layer may have a thickness varying from 50 nm to 150 nm, for example, equal to approximately 70 nm. According to an embodiment, the thickness of each HBM pad 56 is in the range from 500 nm to 1.5 µm, for example equal to approximately 975 nm.

Each insulating layer 48 and 50 may have a monolayer structure or a multilayer structure. According to an embodiment, the single layer forming insulating layer 48, 50 or each layer of insulating layer 48, 50 is made of silicon oxide ($SiO_2$), of silicon nitride (SiN), of silane, or of tetraethyl orthosilicate (TEOS). According to an embodiment, the total thickness of insulating layer 48 or 50 is in the range from 100 nm to 4 µm.

Bonding surface 52 may be defined by a CMP step. The CMP uses an abrasive and corrosive suspension (generally a colloid) in conjunction with a polishing pad maintained on a polishing head. The pad and the electronic circuit board are pressed against each other. The pad has a roughness generally in the order of 50 µm. The polishing head and the board are rotated along parallel and non-concentric axes, so that the pad rubs against the board and causes a removal of material by mechanical action. The abrasive and corrosive chemical suspension is projected by a nozzle on the board and causes a removal of material by chemical etching and by mechanical action. For the step of planarization of bonding surface 52 by CMP to enable to obtain the desired surface state, the local density of conductive material exposed on bonding surface 52 is generally selected to be smaller than or equal to 30%, preferably in the range from 20% to 30%, for example approximately equal to 25%.

In the case where the preparation of the electronic circuit for a hybrid molecular bonding is performed after an operation of testing of the electronic circuit, test pad 14, previously-described, may be formed by one of conductive tracks 44. The inventors have highlighted that the surface defects at the level of the test pads of the electronic circuit may prevent the proper carrying out of known methods of preparing the electronic circuit for a hybrid molecular bonding. In particular, during the preparation of the electronic circuit for the performing of a hybrid molecular bonding, the inventors have shown that the lower insulating layer 48 of the bonding interconnection level 40 which is deposited and which covers the test pad may be insufficiently thick to compensate for the unevennesses of the surface relief of the original electronic circuit 32, in particular when a CMP is subsequently performed, so that the asperity 26, previously described, of test pad 14, may be exposed.

It could be envisaged to increase the thickness of the stack of insulating layers of bonding interconnection level 40, in particular the thickness of lower insulating layer 48 deposited on the test pad and having HBVs 54 formed therein. However, this may be impossible, on the one hand due to the height-to-width aspect ratio which would result therefrom for the openings to be formed in this insulating layer 48 in order to form HBVs 54, which may not be compatible with the techniques used to form these openings, and on the other hand, due to the increase in the electric resistances of these HBVs 54 which would result therefrom and which may not be compatible with the electric properties desired for bonding interconnection level 40.

It could be envisaged to form the test pad in bonding interconnection level 40, the test pad being formed simultaneously to HBM pads 56.

Figure 6:
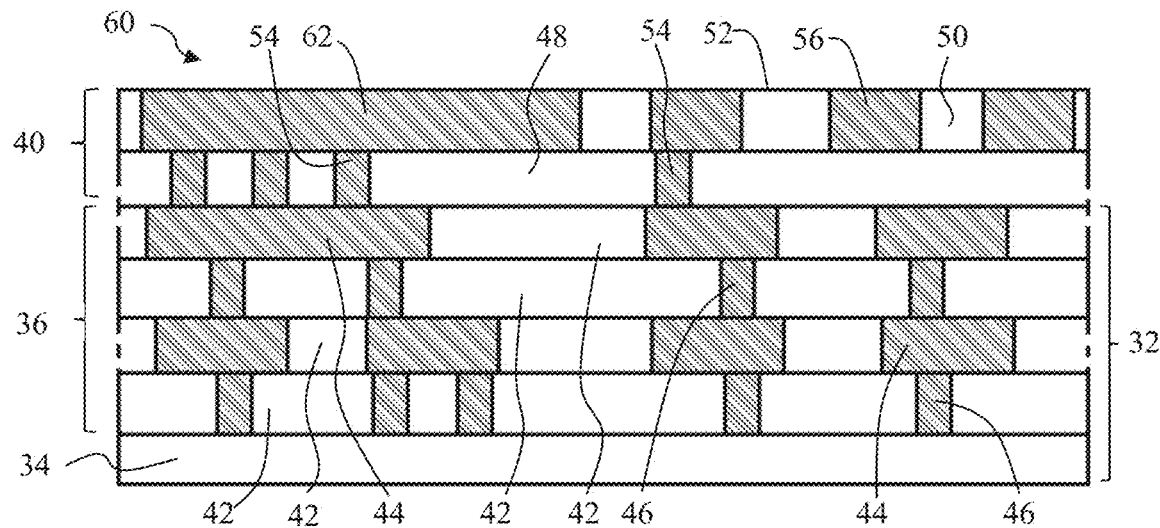
FIG. 6 is a partial simplified lateral cross-section view of an example of an electronic circuit comprising test pads.
Figure 7:
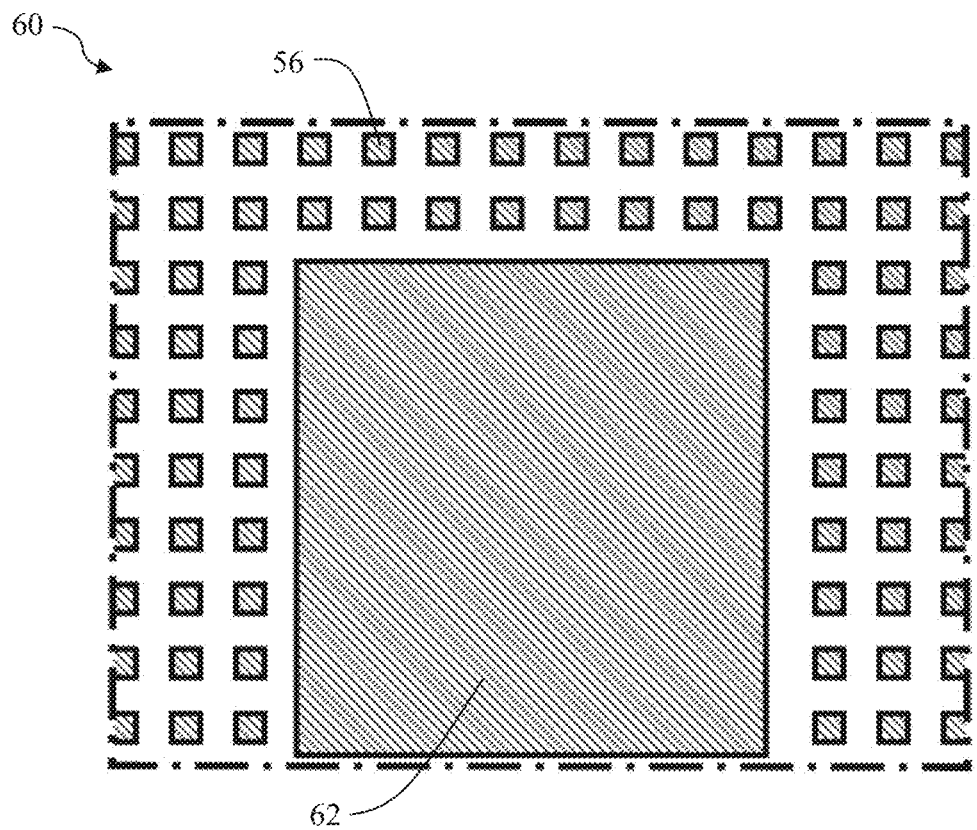
FIG. 7 is a simplified top cross-section view of the electronic circuit of FIG. 6.

FIGS. 6 and 7 are views respectively similar to FIGS. 4 and 5 of an example of an electronic circuit 60 adapted to a hybrid molecular bonding which comprises all the elements of the electronic circuit 30 shown in FIGS. 4 and 5, with the difference that it further comprises at least one test pad 62, generally a plurality of test pads, formed in the same level as HBM pads 56. Test pad 62 has the same composition as that of the previously-described HBM pads 56.

However, the dimensions of test pad 62 are generally imposed by the tools used to perform the test. In particular, for the application of test probes on the test pad, the test pad must have, in top view, a cross-section having a square with a side length greater than 30 µm, preferably greater than 40 µm, for example, equal to approximately 70 µm, inscribed therein. This may not be compatible with the obtaining by CMP of a surface state suitable for bonding surface 52.

Indeed, generally, a CMP method always causes a dishing of HBM pads 56 with respect to the dielectric layer 50 which surrounds them. This dishing increases with the dimensions of HBM pad 56. At the placing into contact of the bonding surfaces of two electronic circuits to perform a hybrid molecular bonding, only the dielectric regions will bond, since HBM pads generally do not bond due to the dishing. However, the placing into contact is followed by a thermal anneal step. This causes an expansion of the HBM pads more significant than the expansion of the dielectric regions and a placing into contact of the HBM pads of the two electronic circuits, which remain bonded at the end of the anneal. This is why the cross-section of an HBM pad in top view generally remains smaller than a square having a 10-µm side length so that the dishing is not too deep and remains compatible with the anneal step which follows the hybrid bonding. However, for test pad 62, the dishing obtained after the CMP step delimiting contact surface 52 is too large, so that, after the thermal anneal step, a local bonding failure between the two electronic circuits can be observed at the level of test pad 62.

Further, the application of test probes on test pad 62 may cause the deformation of the surface of test pad 62 and particularly the forming of asperities at the surface of test pad 62 which may be significant as already previously-described in relation with FIG. 3, so that a subsequent CMP does not enable to obtain bonding surface 52 with a surface state suitable to perform a hybrid molecular bonding.

Figure 8:
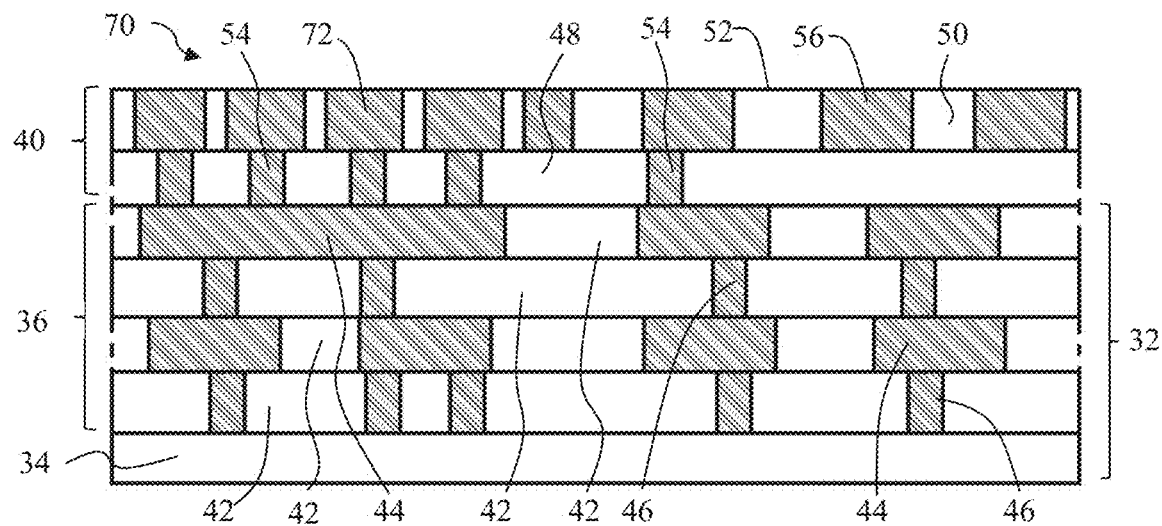
FIG. 8 is a partial simplified lateral cross-section view of an embodiment of an electronic circuit adapted to a hybrid molecular bonding and comprising test pads.
Figure 9:
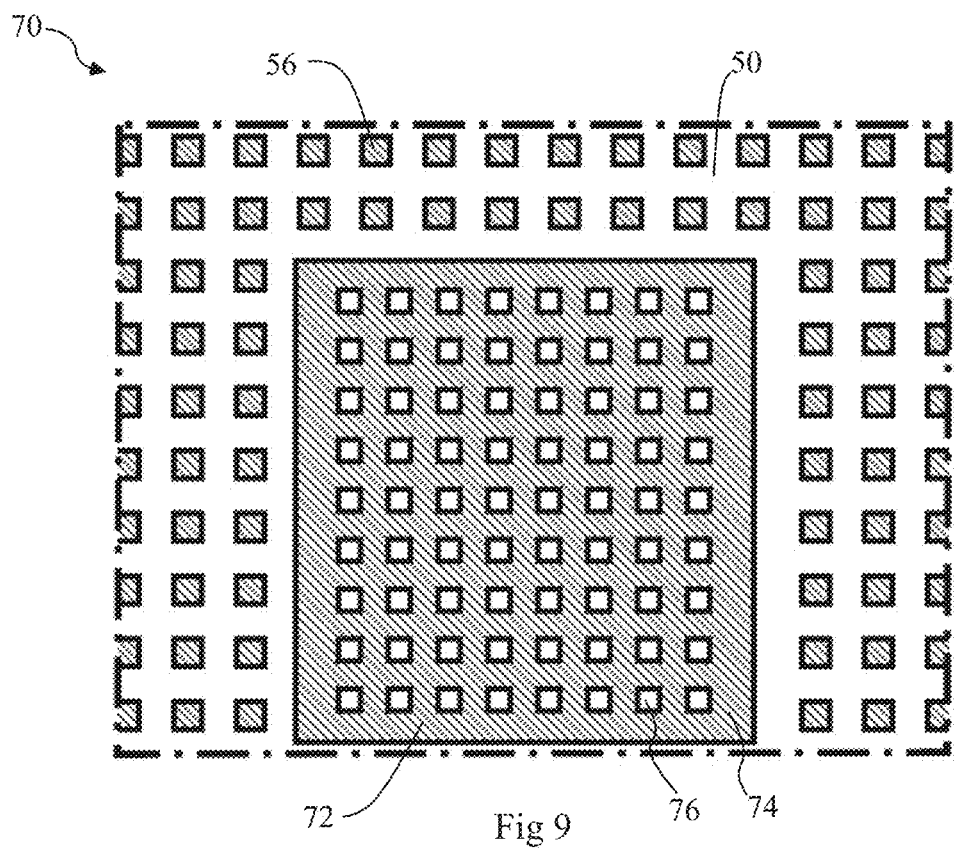
FIG. 9 is a simplified top cross-section view of the electronic circuit of FIG. 8.

FIGS. 8 and 9 are views respectively similar to FIGS. 6 and 7 of an embodiment of an electronic circuit 70 adapted to a hybrid molecular bonding which comprises all the elements of the electronic circuit 60 shown in FIGS. 6 and 7, with the difference that each test pad 62 is replaced with a test pad 72, a single test pad being shown in FIGS. 8 and 9.

Each test pad 72 corresponds to a structure for which the density of conductive material flush with bonding surface 52 is greater than 40%, preferably in the range from 40% to 80%, more preferably in the range from 50% to 70%. The density of conductive material exposed on bonding surface 52 outside of each test pad 72 is smaller than 35%, preferably smaller than 30%, more preferably smaller than 25%. Test pad 72 is inscribed in top view within a square having a side length in the range from 30 μm to 100 μm. Test pad 72 has the same composition as that of the previously-described HBM pads 56. Test pad 72 has a structure such that, at any point of test pad 72 exposed on bonding surface 52, a dimension of the test pad running through this point is smaller than 10 μm, preferably smaller than 5 μm.

In the embodiment shown in FIG. 9, test pad 72 comprises a conductive layer 74 crossed by openings 76 containing the insulating material of insulating layer 50. Each opening 76 may have, in top view, a cross-section inscribed within a square having a side length in the range from 2 μm to 7 μm, for example, equal to approximately 5 μm. The minimum distance between two adjacent openings 76 may be greater than 2 μm, preferably greater than 5 μm.

Figure 10:
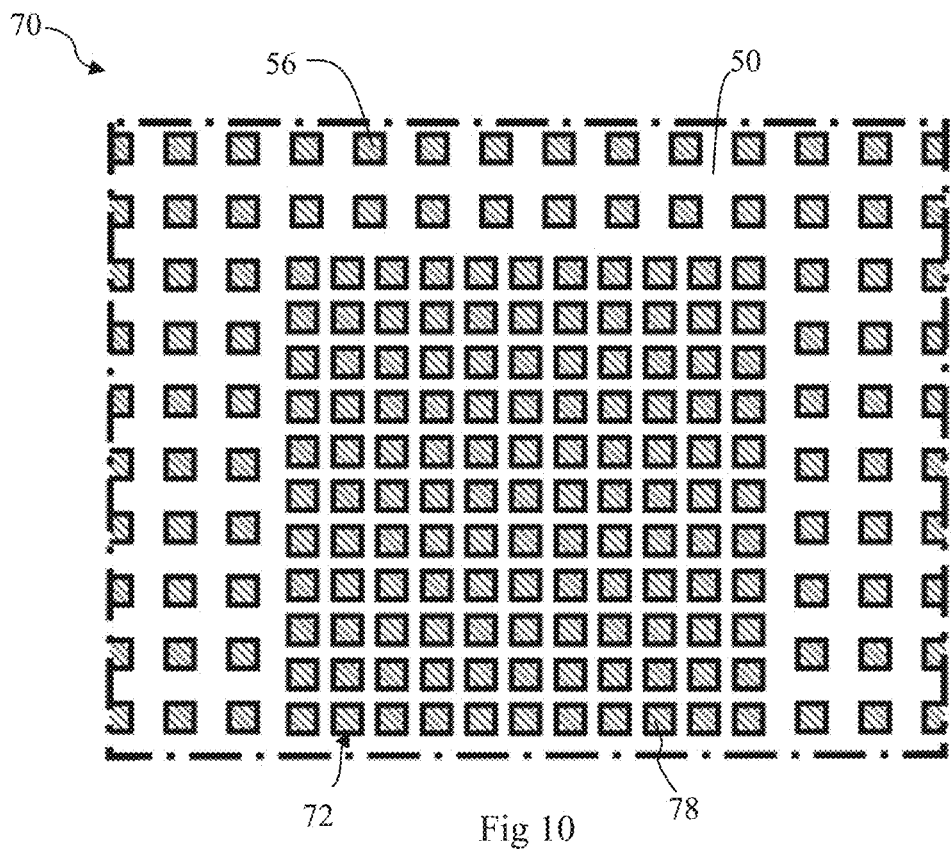
FIG. 10 is a top cross-section view of a variant of the electronic circuit of FIG. 8.

FIG. 10 is a figure similar to FIG. 9 showing a variant of electronic circuit 70 where test pad 72 corresponds to an assembly of conductive pads 78 separated from one another by insulating layer 50. Pads 78 may have the same dimensions as HBM pads 56, the local density of pads 78 being greater than the local density of HBM pads 56. Most pads 78 are connected to conductive tracks 44 by HBVs 54. Preferably, each pad 78 is connected to one of conductive tracks 44 by a HBV 54.

According to another variant, at least a portion of test pad 72 may have the structure previously described in relation with FIG. 9, that is, comprise a conductive layer 72 crossed by openings 76 containing an insulating material, and at least another portion of the test pad may have the structure previously-described in relation with FIG. 10, that is, comprise a dense assembly of conductive pads 78 laterally separated by upper insulating layer 50.

Figure 11:
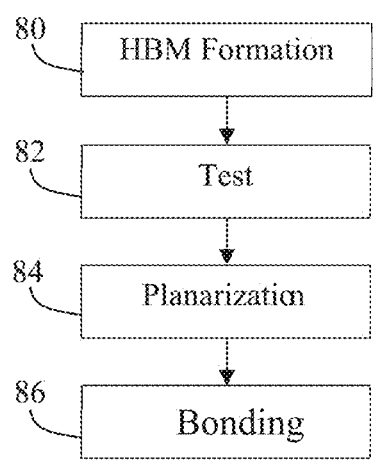
FIG. 11 shows, in a block diagram, an embodiment of a method of manufacturing an electronic system.

FIG. 11 shows, in a block diagram, an embodiment of a method of manufacturing an electronic system comprising a first electronic circuit 70, such as previously described, attached to a second electronic circuit by hybrid molecular bonding.

At a step 80, the method comprises, for each of the electronic circuits, the forming of the bonding interconnection level 40 of electronic circuit 70 comprising at least one test pad 72. The method carries on at step 82. HBM pads 56, HBVs 54, and test pads 72 may be formed according to a manufacturing method where HBVs 54 and HBM pads 56 are formed by distinct steps of deposition of a conductive material, for example, by a method of simple damascene type. As a variant, HBVs 54 and HBM pads 56 may be formed in a single step of deposition of a conductive material, for example, by a method of double damascene type.

At a step 82, which is optional, the method comprises the performing of tests of the proper operation of electronic circuit 70 by using the test pads 72 formed at step 80. The test may comprise the placing into contact of each test pad 72 with a probe. The method carries on at step 84.

At a step 84, which is only implemented when a test has been carried out at step 82, a planarization of bonding surface 52 is performed. This may be performed by CMP. This step enables to obtain a bonding surface 52 with a surface state adapted to the performing of a hybrid molecular bonding. The method carries on at step 86. The inventors have shown that, with the structure of the previously-described test pads, a bonding surface 52 with a surface state adapted to the forming of a hybrid molecular bonding may be obtained by CMP even when a test has been carried out. After the planarization step, the maximum interval between the troughs and the peaks present on bonding surface 52 is smaller than 50 nm, preferably smaller than 20 nm.

At a step 86, a hybrid molecular bonding is performed by the placing into contact of the bonding surfaces 52 of the two electronic circuits 70. The contacting step may be followed by a thermal anneal.

Tests have been performed. For a first test, two first electronic circuit boards have been manufactured with test pads 62, each having the structure according to FIGS. 6 and 7. A measurement of the profile curve of the bonding surface 52 of one of the first boards has been performed. There has been no test step. A hybrid molecular bonding has been performed between the two first electronic circuit boards. An image of the bonding surfaces bonded to each other has been determined by ultrasound analysis on the electronic system obtained after the hybrid molecular bonding, bonding failures appear in the form of lighter pixels on the image.

For a second test, two second electronic circuit boards have been manufactured with test pads 72, each having the structure according to FIGS. 8 and 9. A measurement of the profile curve of the bonding surface of one of the second boards has been performed. There has been no test step. A hybrid molecular bonding has been performed between the two second electronic circuit boards. An image of the bonding surfaces bonded to each other has been determined by scanning acoustic microscopy on the electronic system obtained after the hybrid molecular bonding.

Figure 12:
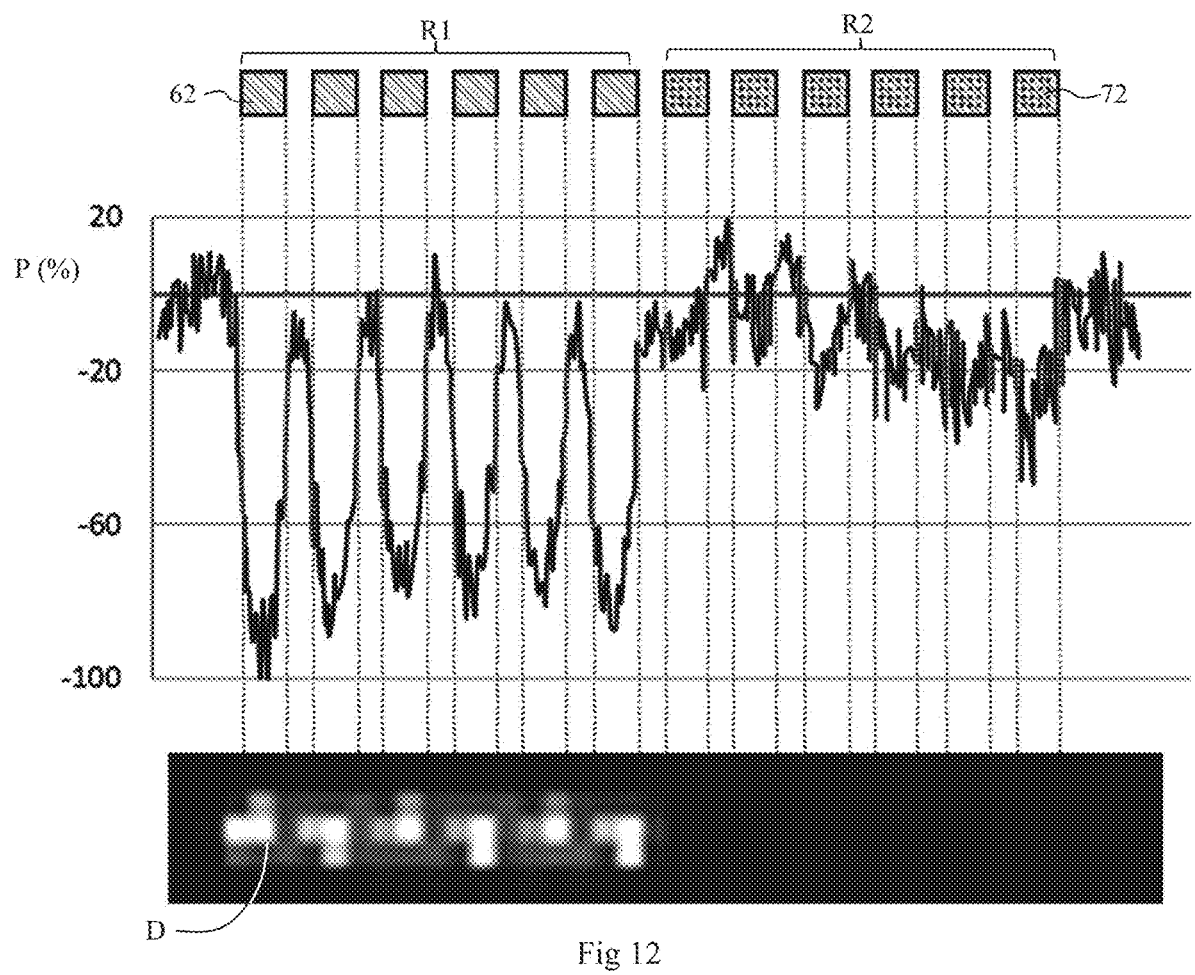
FIG. 12 shows a curve of the profile of the bonding surface of an electronic circuit and a partial image of the bonding surface illustrating bonding failures with a hybrid molecular bonding for, in the left-hand portion, a row of test pads according to FIGS. 6 and 7 and, in the right-hand portion, a row of test pads according to FIGS. 8 and 9.

FIG. 12 shows, in its central portion, a curve of profile P, expressed in percentage, of the bonding surface of an electronic circuit and, in its lower portion, a partial image of the bonding surface illustrating bonding failures for, in the left-hand portion, a row R1 of test pads 62 of the first board and, in the right-hand portion, a row R2 of test pads 72 of the second board.

As shown in this figure, when test pads 62 have the structure according to FIGS. 6 and 7, the profile curve is not compatible with a hybrid molecular bonding, which results in bonding failures (white pixels D). When the test pads have the structure according to FIGS. 8 and 9, the obtained profile curve is compatible with a hybrid molecular bonding, which results in an absence of bonding failures.

Third and fourth tests have been carried out. The third test is identical to the first test, with the difference that a test step followed by a step of CMP planarization have been implemented before the hybrid molecular bonding. The fourth test is identical to the second test, with the difference that a test step followed by a step of CMP planarization have been implemented before the hybrid molecular bonding.

Figure 13:
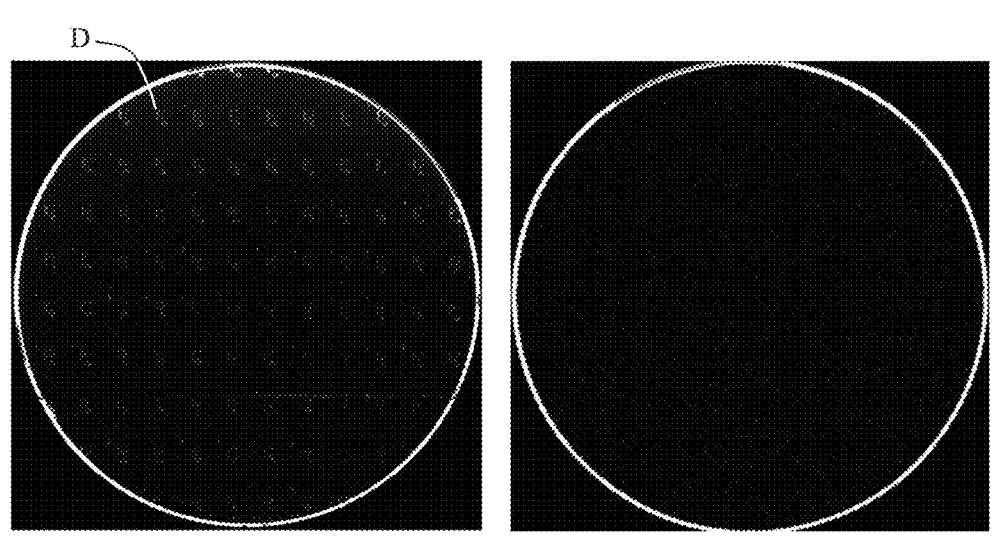
FIG. 13 shows an image of the bonding surface of an electronic circuit board for which tests have been performed for, in the left-hand portion, test pads according to FIGS. 6 and 7 and, in the right-hand portion, test pads according to FIGS. 8 and 9.

FIG. 13 shows an image determined by acoustic microscopy analysis of the bonding surface 52 of the electronic circuit boards of the third test in the left-hand portion and of the fourth test in the right-hand portion.

As shown in this figure, when test pads 62 have the structure according to FIGS. 6 and 7, bonding failures can be observed (white pixels D). When test pads 72 have the structure according to FIGS. 8 and 9, no bonding failures can be observed, which means that the planarization step which follows the test step enables to recover a surface state compatible with the hybrid molecular bonding.

Various embodiments and variants have been described. Those skilled in the art will understand that certain features of these various embodiments and variants may be combined, and other variants will occur to those skilled in the art. Further, although the previously-described embodiments concern an electronic device which comprises the stacking of two electronic circuits, it should be clear that the electronic device may comprise a stack of more than two electronic circuits, and the previously-described embodiments may apply to each interface between two adjacent electronic circuits of the stack.

Finally, the practical implementation of the described embodiments and variations is within the abilities of those skilled in the art based on the functional indications given hereabove.

What is claimed is:

1. An electronic circuit comprising a surface intended to be attached to another electronic circuit by hybrid molecular bonding, the electronic circuit comprising:
    an electrically-insulating layer exposed on said surface;
    distributed in the electrically-insulating layer, first electrically-conductive bonding pads exposed on a first portion of said surface, the density of first bonding pads on the first portion of said surface being smaller than 30%; and
    at least one electrically-conductive test pad, exposed on a second portion of said surface containing a square having a side length greater than 30 μm, the density of electrically-conductive material of the test pad exposed on the second portion of said surface being in the range from 40% to 80% and, everywhere in the second portion of said surface, at least one dimension of the electrically-conductive material exposed on the second portion of said surface being smaller than 10 μm.

2. The electronic circuit according to claim 1, wherein the test pad comprises a electrically-conductive layer exposed on said surface and crossed by openings containing an electrically-insulating material.

3. The electronic circuit according to claim 1, wherein the test pad comprises second electrically-conductive bonding pads exposed on said surface and laterally separated by the electrically-insulating layer.

4. The electronic circuit according to claim 1, wherein the test pad has the same composition as the first bonding pads.

5. The electronic circuit according to claim 1, wherein the density of the electrically-conductive material of the test pad exposed on the second portion of said surface is in the range from 50% to 80%.

6. The electronic circuit according to claim 1, wherein everywhere in the second portion, at least one dimension of the electrically-conductive material of the test pad exposed on the second portion of said surface is smaller than 5 μm.

7. A method comprising the manufacturing of an electronic circuit comprising a surface intended to be attached to another electronic circuit by hybrid molecular bonding, the method comprising the steps of:
    forming an electrically-insulating layer exposed on said surface;
    forming first electrically-conductive bonding pads, distributed in the electrically-insulating layer, exposed on a first portion of said surface, the density of the first bonding pads on the first portion of said surface being smaller than 30%; and
    forming of at least one electrically-conductive test pad, exposed on a second portion of said surface containing a square having a side length greater than 30 μm, the density of electrically-conductive material of the test pad exposed on the second portion of said surface being in the range from 40% to 80% and, everywhere in the second portion of said surface, at least one dimension of the electrically-conductive material of the test pad exposed on the second portion of said surface being smaller than 10 μm.

8. The method according to claim 7, comprising the hybrid molecular bonding of said surface to another electronic circuit.

9. The method according to claim 8, further comprising a step of testing of the operation of the electronic circuit by using the test pad before the hybrid molecular bonding step.

10. The method according to claim 9, further comprises a step of planarization of said surface after the test step and before the hybrid molecular bonding step.

* * * * *